(12) United States Patent
Hu et al.

(10) Patent No.: US 9,776,673 B2
(45) Date of Patent: *Oct. 3, 2017

(54) WRITE-ERASE ENDURANCE LIFETIME OF MEMORY STORAGE DEVICES

(75) Inventors: Xiao-yu Hu, Rueschlikon (CH); Evangelos S. Eleftheriou, Rueschlikon (CH); Robert Haas, Rueschlikon (CH)

(73) Assignee: SK Hynix Inc., Gyeonggi-do (KR)

( * ) Notice: Subject to any disclaimer, the term of this patent is extended or adjusted under 35 U.S.C. 154(b) by 644 days.

This patent is subject to a terminal disclaimer.

(21) Appl. No.: 13/567,403

(22) Filed: Aug. 6, 2012

(65) Prior Publication Data

US 2012/0303919 A1    Nov. 29, 2012

Related U.S. Application Data

(62) Division of application No. 12/511,577, filed on Jul. 29, 2009.

(51) Int. Cl.
*G06F 12/00* (2006.01)
*B62D 35/00* (2006.01)
(Continued)

(52) U.S. Cl.
CPC ....... *B62D 35/001* (2013.01); *G06F 12/0246* (2013.01); *G11C 16/349* (2013.01);
(Continued)

(58) Field of Classification Search
None
See application file for complete search history.

(56) References Cited

U.S. PATENT DOCUMENTS

| | | |
|---|---|---|
| 6,895,464 B2 | 5/2005 | Chow et al. |
| 6,973,531 B1 | 12/2005 | Chang et al. |

(Continued)

FOREIGN PATENT DOCUMENTS

| | | | |
|---|---|---|---|
| CN | 101441599 A | 5/2009 |
| CN | 101477492 A | 7/2009 |

(Continued)

OTHER PUBLICATIONS

International Search Report and Written Opinion for PCT Application No. PCT/IB2010/053382, dated Oct. 21, 2010, pp. 1-14.

(Continued)

*Primary Examiner* — Baboucarr Faal
(74) *Attorney, Agent, or Firm* — IP & T Group LLP

(57) ABSTRACT

A memory management system and method for managing memory blocks of a memory device of a computer. The system includes a free block data structure including free memory blocks for writing, and sorting the free memory blocks in a predetermined order based on block write-erase endurance cycle count and receiving new user-write requests to update existing data and relocation write requests to relocate existing data separately, a user-write block pool for receiving youngest blocks holding user-write data (i.e., any page being updated frequently) from the free block data structure, a relocation block pool for receiving oldest blocks holding relocation data (i.e., any page being updated infrequently) from the free block data structure, and a garbage collection pool structure for selecting at least one of user-write blocks and relocation blocks for garbage collection, wherein the selected block is moved back to the free block data structure upon being relocated and erased.

13 Claims, 4 Drawing Sheets

(51) Int. Cl.
*G06F 12/02* (2006.01)
*G11C 16/34* (2006.01)

(52) U.S. Cl.
CPC .. *G11C 16/3495* (2013.01); *G06F 2212/1044* (2013.01); *G06F 2212/7205* (2013.01); *G06F 2212/7211* (2013.01)

(56) References Cited

U.S. PATENT DOCUMENTS

| | | |
|---|---|---|
| 7,096,313 B1 | 8/2006 | Chang et al. |
| 7,139,863 B1 | 11/2006 | DeFouw et al. |
| 8,402,242 B2 | 3/2013 | Hu et al. |
| 2003/0225961 A1 | 12/2003 | Chow et al. |
| 2008/0104357 A1 | 5/2008 | Kim et al. |
| 2008/0235306 A1 | 9/2008 | Kim et al. |
| 2008/0282025 A1 | 11/2008 | Biswas et al. |
| 2011/0029715 A1 | 2/2011 | Hu et al. |

FOREIGN PATENT DOCUMENTS

| | | |
|---|---|---|
| EP | 1804168 A1 | 7/2007 |
| WO | WO 2010/132140 | 11/2010 |
| WO | WO 2011/013054 | 2/2011 |

OTHER PUBLICATIONS

Office Action issued by the United Kingdom Intellectual Property Office on Aug. 3, 2015.

WRITE-ERASE ENDURANCE LIFETIME OF MEMORY STORAGE DEVICES

CROSS-REFERENCES TO RELATED APPLICATION

This application is a divisional of U.S. application Ser. No. 12/511,577 filed Jul. 29, 2009, the disclosure of which is incorporated by reference herein in its entirety.

BACKGROUND

The present invention relates to data storage devices, and more specifically, to a memory management system and method for improving write-erase endurance lifetime of a flash-based solid state drive (SDD) device via data placement, garbage collection and wear-leveling processes.

Currently, SSD devices based on NAND-flash memories are used as the primary storage in computer architecture, ranging from notebooks to enterprise storage systems. These devices provide random I/O performance and access latency that are orders of magnitude better than that of rotating hard-disk drives (HDD). Moreover, SSDs significantly reduce power consumption and dramatically improve robustness and shock resistance. NAND-flash memories are organized in terms of blocks, where each block consists of a fixed number of pages and the block is the elementary unit for an erase operation, whereas reads and writes are processed in terms of pages. Before data can be written to a page (the page is programmed with the data) in a block, the block has to be erased beforehand. Having larger blocks as the unit of erase and smaller pages as the unit of read and write in an SSD leads to "write amplification" where the SSD has to do overhead housekeeping writes when servicing user writes from the host system. The NAND-flash memories have a limited write-erase cycle count. Typically, flash chips based on single-level cells (SLC) sustain $10^5$ and those based on multi-level cells (MLC) $10^4$ program-erase cycles.

Flash memory uses relocate-on-write (i.e., out-of-place write) for performance reasons, for example. If write-in-place is used instead, flash will exhibit high latency due to the necessary reading, erasing and reprogramming (i.e., writing) of the entire block in which the data is being updated. The management of out-of-place updates involves a mapping between logical block addresses (LBA) that are assigned to each user page write, and physical block addresses (PBA) which are the physical page addresses in flash memory.

Relocate-on-write necessitates a garbage collection process which results in a performance penalty for additional read and write operations. The number of read and write operations resulting from garbage collection depends on the block utilization.

Flash memory blocks eventually wear out with progressing number of write-erase cycles until they can no longer be erased or written. Wear-leveling techniques are therefore used to exhaust the cycle budget of as many blocks as possible, in order to serve as many user writes as possible (i.e., to maximize endurance). The SSD device may eventually die with a number of unconsumed cycle budget left when garbage collection can no longer return a free block, referred to as "wear-leveling insufficiency".

Uneven wear-out of flash memory blocks is mainly due to spatial localities in workloads. The wear-out of blocks gradually becomes increasingly unbalanced. Static wear-leveling is commonly used to deal with this cause of uneven wear-out by forcing the migration of cold data (i.e., data which is not updated frequently) from new blocks to old blocks and freeing the newer blocks for holding hot data. The increase of write amplification due to static wear-leveling depends on how frequently cold data is moved around. Both garbage collection and wear-leveling contribute write operations in addition to user writes, hence, the write-erase endurance lifetime which can be measured by the total number of user writes that can be served, depends on the total cycle budget available, write amplification, and the eventual unconsumed cycle budget due to wear-leveling insufficiency.

Today, wear-leveling has been recognized as a standard way to improve the endurance lifetime of flash-based SSD devices. However, the endurance lifetime of the SSD device depends not only on wear-leveling but also data placement and garbage collection.

SUMMARY

The present invention provides a method and system that improves the write-erase endurance lifetime of a flash-based SSD via a combination of data placement, garbage collection and wear-leveling processes.

According to an embodiment of the present invention, a memory management system for a memory device of a computer is provided. The system includes a free block data structure including a plurality of free memory blocks for writing, the free block data structure configured to sort the free memory blocks in a predetermined order based on block write-erase endurance cycle count. The free block data structure is further configured to receive new user-write requests to update existing data and relocation write requests to relocate existing data separately such that user-write data from new user-write requests are placed on youngest free memory blocks having lower block write-erase endurance cycle count while relocation data from relocation requests are placed on oldest free memory blocks having higher block write-erase endurance cycle count than that of the youngest free memory blocks. The system further includes a user-write data structure configured to receive user-write memory blocks holding the user-write data from the free block data structure, a relocation data structure configured to receive relocation memory blocks holding the relocation data from the free block data structure, and a garbage collection pool structure configured to select at least one of the user-write blocks and relocation blocks for erasure, wherein the selected block is moved to the free block data structure upon being erased.

According to another embodiment of the present invention, a memory management system for a memory device of a computer is provided. The system includes a free block data structure including a plurality of free memory blocks for writing, the free block data structure is configured to sort the free memory blocks in a predetermined order based on block write-erase endurance cycle count. The free block data structure is also configured to receive new user-write requests to update existing data and relocation write requests to relocate existing data such that user-write data from new user-write requests are placed on youngest free memory blocks having lower block write-erase endurance cycle count while relocation data from relocation requests are placed on oldest free memory blocks having higher block write-erase endurance cycle count than that of the youngest free memory blocks. The system further includes a delay block data structure configured to receive memory blocks holding the user-write data and memory blocks holding the relocation data from the free block data structure and delay the memory blocks from being immediately selected as a candidate for garbage collection, and a garbage collection pool structure configured to receive memory blocks from the delay block data structure, and select at least one of the memory blocks for erasure, wherein the selected memory block is moved to the free block data structure upon being erased.

According to yet another embodiment of the present invention, a computer-implemented method of managing memory blocks within a memory device of a computer is provided. The method includes maintaining free memory blocks for writing in a predetermined order based on block write-erase endurance cycle count and receiving new user-write requests to update existing data and relocation write requests to relocate existing data, placing user-write data from the new user-write requests on youngest free memory blocks having lower block write-erase endurance cycle count, placing relocation data from the relocation write requests on oldest free memory blocks having higher block write-erase endurance cycle count than that of the youngest free memory blocks, maintaining user-write memory blocks holding the user-write data and relocation memory blocks holding the relocation data, and selecting at least one of the user-write memory blocks or the relocation memory blocks for erasure.

According to another embodiment of the present invention, a computer program product implemented the above-mentioned method is also provided.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
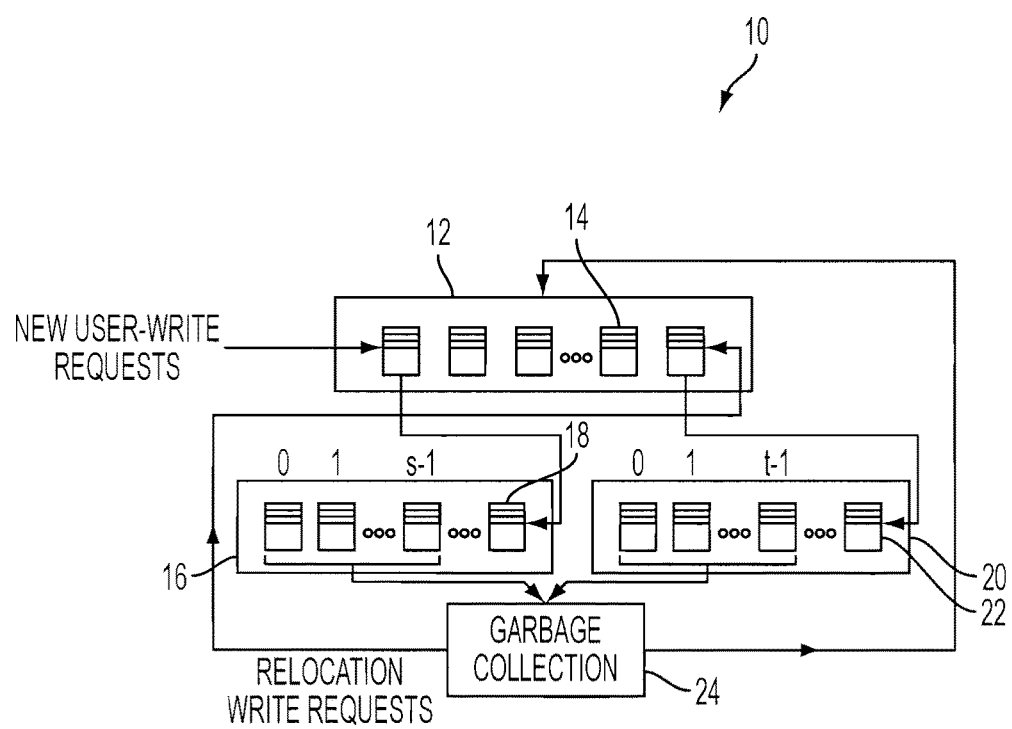
FIG. 1 is a block diagram illustrating a flash memory management system that can be implemented within embodiments of the present invention.

With reference now to FIG. 1, there is a flash memory management system that can be implemented within an embodiment of the present invention. One embodiment of the present invention uses data placement, garbage collection and wear-leveling processes based on separation and prediction to improve the write-erase endurance lifetime of a flash-based SSD device. The system 10 dynamically separates blocks with dynamic data pages from blocks with static data pages (i.e., pages with fewer updates) based on the prediction that dynamic data tends to wear out blocks faster than those with static data and therefore the dynamic data pages are placed on younger blocks which have the lower block write-erase endurance cycle count (i.e., the higher remaining unconsumed cycle count) and static data pages are placed on older blocks whenever possible.

Figure 4:
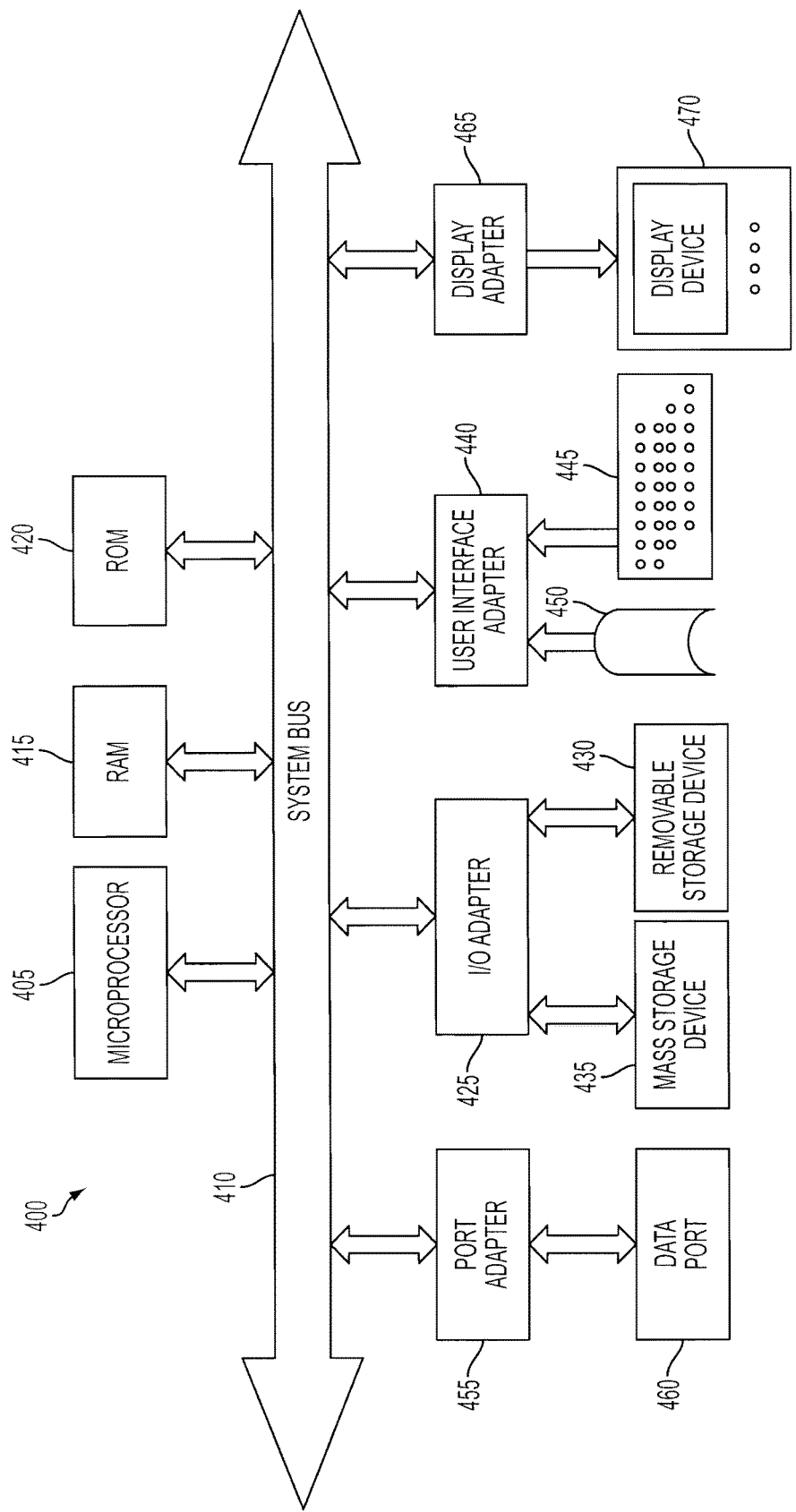
FIG. 4 is a block diagram of a general purpose computer that can be implemented within embodiments of the present invention.

As shown in FIG. 1, a memory management system 10 for a memory device of a computer (as depicted in FIG. 4) is provided. The system 10 includes a free block data structure 12 (i.e., a free block pool) including a plurality of free memory blocks 14 for writing. The free block pool 12 sorts the free memory blocks 14 in a predetermined order based on block write-erase endurance cycle count. For example, according to one embodiment of the present invention, the free memory blocks 14 are sorted in an ascending order based upon the block write-erase endurance cycle count such that the left-most free memory block 14 has the least write-erase endurance cycle count and the right-most free memory block 14 has the highest write-erase endurance count. That is, the free memory blocks 14 are sorted from youngest to oldest based on block write-erase endurance count. According to an embodiment of the present invention, the free block pool 12 receives new user-write requests via a user of the system 10, to update existing data and relocation write requests via a garbage collection process (inside the system 10), to relocate existing data separately. According to an embodiment of the present invention, the system 10 separates user-write data stream from relocation data stream since the relocation data pages can be considered as more "static" compared to user data pages.

According to an embodiment of the present invention, if the system 10 includes blocks with different write-erase cycle budgets, for example, if there is a mix of single-level cells (SLC) and multi-level cells (MLC) Flash, the free block pool 12 is organized according to the remaining write-erase cycle count of the block, with the block having the highest remaining (unconsumed) write-erase cycle count to the left (i.e., the youngest block).

Further, as shown in FIG. 1, the system 10 includes a user-write data structure 16 (i.e., a user-write block pool) and a relocation data structure 20 (i.e., a relocation block pool). According to an embodiment of the present invention, when the left-most free memory block 14 is filled up with user-write data pages, the memory block 14 is then removed from the free block pool 12 and is pushed into the user-write block pool 16. Further, when the right-most memory block 14 is filled up with relocation data pages, it is then removed from the free block pool 12 and pushed into the relocation block pool 20. According to an embodiment of the present invention, both the user-write block pool 16 and the relocation block pool 20 may be managed by a data structure, and in the current embodiment, the pool is managed by a queue data structure, meaning that the newly-filled up block is placed at the end of each queue. Thus, the user-write data structure 16 receives user-write memory blocks 18 holding user-write data pages from the free block pool 12 and the relocation block pool 20 receives relocation memory blocks 22 (i.e., the last memory blocks) holding relocation data pages from the free block pool 12. This is to say, according to an embodiment of the present invention, user-write data pages are placed on youngest block and the relocation data pages on the oldest block in the free block pool 12.

According to an embodiment of the present invention, the system 10 further includes a garbage collection pool structure 24 that selects at least one block from a combination of a few of the user-write memory blocks 18 and the relocation memory blocks 22 from the user-write block pool 16 or relocation block pool 20.

According to an embodiment of the present invention, a flash controller of the memory storage device may control the above-mentioned data structures as well as the functions of the garbage collection pool structure 24. According to one embodiment of the present invention, a windowed garbage collection process is implemented based on a predetermined rule for selection. The garbage collection process is triggered by monitoring the number of free memory blocks 14 in the free block pool 12 in order to guarantee a minimum number of free memory blocks 14. The garbage collection process looks for a memory block within a window of user-write memory blocks 18 starting from the left-most in the user-write block pool 16 and a window of relocation memory blocks 20 starting from the leftmost in the relocation block pool 22.

According to an embodiment of the present invention, the blocks to be selected for garbage collection may come from either the user-write block pool 16 or the relocation block pool 20. According to an embodiment of the present invention, the garbage collection process may be performed over a window of s+t blocks, where s candidate blocks are from the user-write block pool 16 and t candidate blocks are from the relocation block pool 20, and s blocks and t blocks are from the beginning of each data structure 16 and 20 which are those blocks entering into pool at earlier times. According to an embodiment of the present invention, the window size of s candidate blocks in the user-write block pool 16 and the window size of t candidate blocks in the relocation block pool 20 may be equal or unequal.

According to an embodiment of the present invention, the garbage collection process is performed by selecting a block for recycling from the garbage collection window of s+t according to a predetermined rule. There are several rules which may be implemented within embodiments of the present invention. For example, one embodiment of the present invention is based on the following rule, to achieve a good level of wear-leveling while maintaining a high reclaiming efficiency:

If all blocks in the system 10 have $N_p$ pages and the average remaining (unconsumed) cycle count at the time of garbage collection is A. The following rule is used to select the j*-th block for garbage collection such that $$j^* = \arg\max(WI_j + D_j) \text{ for } j = 0, \ldots, (s+t)-1$$

where W is an appropriate weight factor taking an integer value larger than 1 and $D_j = \max(C_j - A, 0)$, and where $I_j$ is the number of invalid data pages on the j-th block of the s+t blocks in the garbage window, where $j = 0, \ldots, (s+t)-1$ and $C_j$ represents the remaining (unconsumed) endurance cycle count of the respective block. According to an embodiment of the present invention, W can be selected via simulation to maximize the endurance lifetime of the system 10.

Upon selecting a block for garbage collection, the garbage collection first reads all pages on that block that are still valid data pages and then write the pages to another block. The write requests from garbage collection are called relocation requests and are placed on oldest free memory blocks 14, as illustrated in FIG. 1. The LBA-to-PBA map tells garbage collection which data pages are valid or invalid. A data page is becoming invalid when the data pages is updated by the user and is written to another place. Once all valid data pages of the selected block have been relocated, the selected block is then erased. Upon being successfully erased, the selected block is removed from user-write block pool 16 or relocation block pool 20, and is put into free block pool 12.

The implementation of a windowed garbage collection process reduces write amplification and wear-leveling insufficiency, thereby improving the write-erase endurance lifetime of a flash-based storage device.

According to another embodiment of the present invention, the number of candidate blocks from the user-write block pool 16 and the relocation block pool 20 may be changed. For example, if the system 10 is busy with a heavy user write workload, the garbage collection window may be changed to include blocks from user-write block pool 16 only in order to temporarily maximize recycling efficiency. On the other hand, when the system 10 is idle, the garbage collection window may include blocks mostly selected from the relocation block pool 20 and only few blocks selected from the user-write block pool 16, thereby speeding up the wear-leveling process. The present invention is not limited to the system shown in FIG. 1 and may vary as necessary. An alternative flash memory management will be discussed below with reference to FIG. 2.

Figure 2:
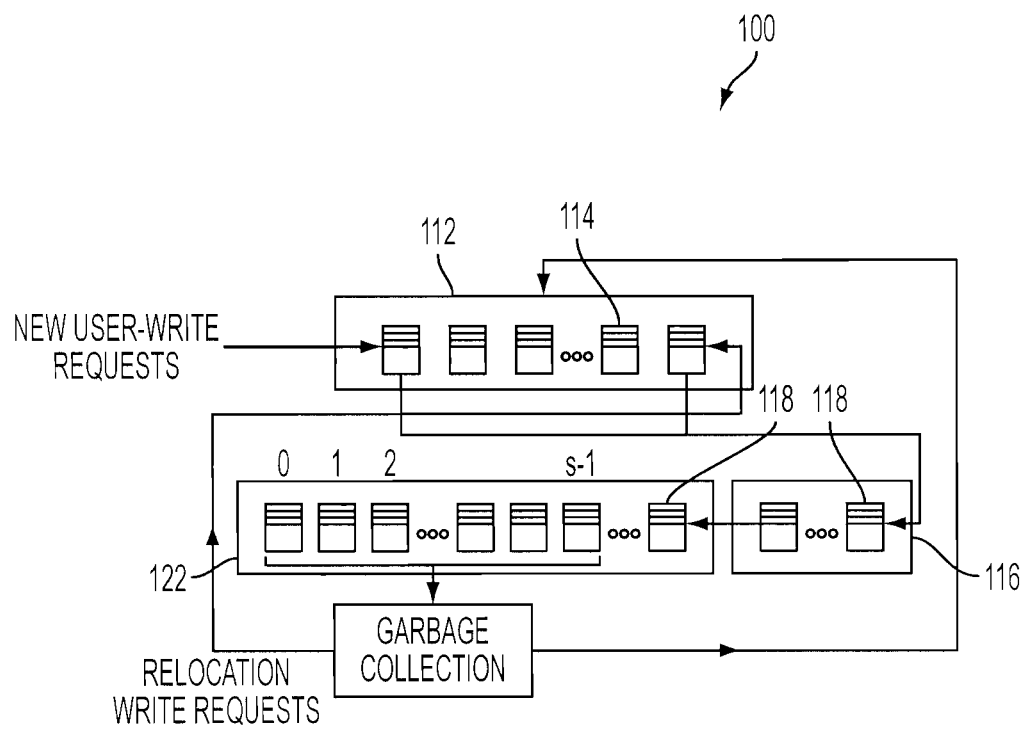
FIG. 2 is a block diagram illustrating a flash memory management system that can be implemented within alternative embodiments of the present invention.

Instead of managing the user-write block pool 16 and the relocation block pool 20 separately as shown in FIG. 1, these two pools 16, 20 may be merged and managed together as shown in FIG. 2 according to another embodiment of the present invention as discussed below.

FIG. 2 is a block diagram illustrating a flash memory management system that can be implemented within alternative embodiments of the present invention. As shown in FIG. 2, a flash memory management system 100 having a delay block data structure (i.e., a first in-first out (FIFO) queue) is provided to delay the entry of a newly written block into the garbage collection pool structure. The flash memory management system 100 includes a free block data structure 112 including a plurality of free memory blocks 114 for writing data. The free block data structure 112 is configured similar to that shown in FIG. 1. The free block data structure 112 sorts the free memory blocks 114 in a predetermined order based on block write-erase endurance cycle count, and receives user-write requests to update existing data and relocation write requests to relocate existing data onto free memory blocks 114. Further, the system 110 includes a delay block data structure 116 which receives first (i.e., the youngest) memory blocks 118 holding user-write data pages (which may be more dynamic) and the last (the oldest) memory blocks 120 holding relocation data pages (which may be comparably static) from the free block data structure 112. As mentioned above, according to an embodiment of the present invention, the delay block data structure 116 may be a FIFO queue in which a newly-filled up block 118 either holding user-write data pages or relocation ones, is pushed onto the delay block data structure 116 on one side. Every time there is a block 118 being pushed onto the delay block data structure 116 on one side, there is a block 118 being pushed out of the delay block data structure 116 from the other (i.e., opposite) side, and that block 118 then enters into a garbage collection pool structure 122, as illustrated in FIG. 2. Thus, the garbage collection pool structure 122 receives memory blocks 118 from the delay block data structure 116, and selects at least one of the memory blocks 118 for garbage collection. Upon data pages being relocated and the block 118 being erased, the selected block 118 is moved to the free block data structure 112 for writing data. A method for managing memory blocks within a memory device will now be discussed below with reference to FIG. 3.

Figure 3:
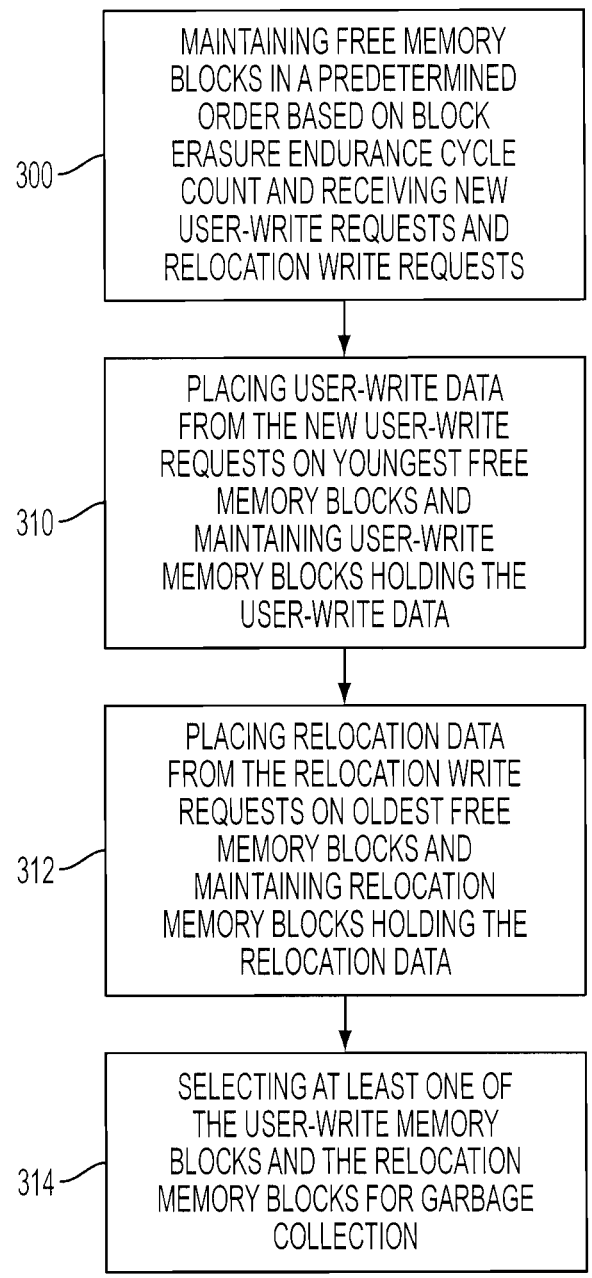
FIG. 3 is a flowchart illustrating a method for managing memory blocks in a memory device that can be implemented within embodiments of the present invention.

FIG. 3 is a flowchart illustrating a method for managing memory blocks in a memory device that can be implemented within embodiments of the present invention. In FIG. 3, at operation 300, free memory blocks for writing are maintained in a predetermined order (from the youngest to the oldest, for example) based on block write-erase endurance cycle count. New user-write requests to update existing data are received along with relocation write requests to relocate existing data onto the free memory blocks. According to an embodiment of the present invention, free memory blocks are maintained by being sorted in an ascending order based on block write-erase endurance cycle count such that the left-most free memory block is the youngest and the right-most free memory block is the oldest, namely has a least amount remaining (unconsumed) cycle count.

From operation 300, the process moves to operation 310 where user-write data from the new user-write requests are placed on youngest free memory blocks. Upon filling up the youngest free memory block with user-write pages, the youngest memory block (i.e., now a user-write memory block) is removed from the free block pool and pushed into a user-write block pool where it is maintained. According to an embodiment of the present invention, inside the free block pool the second youngest memory block now emerges as the youngest memory block and is used to hold user-write requests.

According to an embodiment of the present invention, it may be determined whether a data page involved is frequently updated or not. In case a data page is infrequently being updated, the page is placed on the oldest free memory blocks, similar to the relocation requests.

From operation 310, the process moves to operation 312 where relocation data pages from the relocation requests are placed on oldest free memory blocks which have data that is least frequently updated. Once the oldest free memory block is filled up with relocation data pages, is the oldest free memory block (i.e. now a relocation memory block) is removed from the free block pool and it enters a relocation block pool where it is maintained.

According to an embodiment of the present invention, both the user-write block pool and the relocation block pool can be managed by queue data structure, namely the newly filled-up blocks enter from one end of the queue, and the garbage collection window is set on the other end of the queue.

From operation 312, the process moves to operation 314 where at least one of the memory blocks of the user-write memory blocks and the relocation memory blocks is selected for garbage collection. According to an embodiment of the present invention, the at least one memory block is selected with a window for erasure based on a predetermined rule. According to one embodiment of the present invention, the at least one memory block is selected from a window of user-write memory blocks and a window of relocation blocks, which are managed separately. According to another embodiment, the at least one memory block may be selected from a window formed by a combination of user-write memory blocks and relocation memory blocks that are managed together. That is, as shown in FIG. 2, the user-write block pool is merged with relocation block pool.

Generally, the flash memory management systems and method for managing memory blocks within a memory device according to embodiments of the present invention as described herein are practiced with a general-purpose computer and the method may be coded as a set of instructions on removable or hard media for use by the general-purpose computer. FIG. 4 is a schematic block diagram of a general-purpose computer suitable for practicing the present invention embodiments. In FIG. 4, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

In view of the above, the present method embodiment may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above.

Embodiments of the present invention include flash memory management system and a method for managing memory blocks within a memory device of a computer system via data placement (i.e., separation and sorting), garbage collection and wear-leveling. Therefore, the present invention provides the advantages of reducing write amplification since the system discloses moving static data into blocks that are relatively older and dynamic data into blocks that are relatively younger. The present invention also achieves wear-leveling by balancing the cycle count usage of the various blocks and correcting any possible imbalance while improving the performance of the memory device and the endurance lifetime of the memory device by reducing the necessary write operations.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A memory management system for a memory device of a computer, the system comprising:
    a free block data structure including a plurality of free memory blocks for writing, the free block data structure is configured to sort the free memory blocks in a predetermined order based on block write-erase endurance cycle count and to receive new user-write requests to update existing data and relocation write requests to relocate existing data such that user-write data from new user-write requests are placed on youngest free memory blocks having lower block write-erase endurance cycle count while relocation data from relocation requests are placed on oldest free memory blocks having higher block write-erase endurance cycle count than that of the youngest free memory blocks;
    a delay block data structure configured to receive memory blocks holding the user-write data and memory blocks holding the relocation data from the free block data structure and delay the memory blocks from being immediately selected as a candidate for garbage collection; and
    a garbage collection pool structure configured to receive memory blocks from the delay block data structure, and select at least one of the memory blocks for erasure, wherein the selected memory block is moved to the free block data structure upon being erased.

2. The system of claim 1, wherein the delay block data structure is a first in first out (FIFO) queue.

3. The system of claim 2, wherein either a memory block holding userwrite pages or a memory block holding relocation data pages is received at one side of the delay block data structure, and either a memory block holding user-write pages or a memory block holding relocation data pages is pushed out of the delay block data structure at an opposite side of the delay block data structure and into the garbage collection pool structure.

4. A computer-implemented method of managing memory blocks within a memory device, the method comprising:
    maintaining free memory blocks for writing in a predetermined order based on block write-erase endurance cycle count and receiving new user-write requests to update existing data and relocation write requests to relocate existing data;
    placing user-write data from the new user-write requests on youngest free memory blocks having lower block write-erase endurance cycle count;
    placing relocation data from the relocation write requests on oldest free memory blocks having higher block write-erase endurance cycle counter than that of the youngest free memory blocks;
    delaying user-write memory blocks holding the user-write data and relocation memory blocks holding the relocation data from being immediately selected as a candidate for garbage collection, by receiving the user-write memory blocks and the relocation memory blocks into a delay block structure; and
    selecting from the delay block structure, at least one of the user-write memory blocks or the relocation memory blocks for erasure, wherein the selected at least one of the user-write memory blocks or the relocation memory blocks is moved into the free memory blocks upon being erased.

5. The computer-implemented method of claim 4, wherein selecting at least one of the user-write memory blocks or the relocation memory blocks comprises:
    selecting at least one memory block from a window of user-write memory blocks and a window of relocation memory blocks, which are managed separately.

6. The computer-implemented method of claim 5, wherein a size of the window of the user-write memory blocks is equal to a size of the window of relocation memory blocks.

7. The computer-implemented method of claim 5, wherein a size of the window of the user-write memory blocks is unequal to a size of the window of relocation memory blocks.

8. The computer-implemented method of claim 4, wherein selecting at least one of the user-write memory blocks or the relocation memory blocks comprises:
    selecting at least one memory block from a window formed by a combination of userwrite memory blocks and relocation memory blocks.

9. A computer program product comprising a non-transitory computer useable medium having stored thereon a computer readable program, wherein the computer readable program when executed on a computer causes the computer to implement a method for managing memory blocks within a memory device, the method comprising:

maintaining free memory blocks for writing in a predetermined order based on block write-erase endurance cycle count and receiving new user-write requests to update existing data and relocation write requests to relocate existing data;

placing user-write data from the new user-write requests on youngest free memory blocks having lower block write-erase endurance cycle count;

placing relocation data from the relocation write requests on oldest free memory blocks having higher block write-erase endurance cycle count than that of the youngest free memory blocks;

delaying user-write memory blocks holding the user-write data and relocation memory blocks holding the relocation data from being immediately selected as a candidate for garbage collection, by receiving the user-write memory blocks and the relocation memory blocks into a delay block structure; and selecting from the delay block structure, at least one of the user-write memory blocks or the relocation memory blocks for erasure, wherein the selected at least one of the user-write memory blocks or the relocation memory blocks is moved into the free memory blocks upon being erased.

10. The computer program product of claim 9, wherein selecting at least one of the user-write memory blocks or the relocation memory blocks comprises:

selecting at least one memory block from a window of user-write memory blocks and a window of relocation memory blocks, which are managed separately.

11. The computer program product of claim 10, wherein a size of the window of the user-write memory blocks is equal to a size of the window of relocation memory blocks.

12. The computer program product of claim 10, wherein a size of the window of the user-write memory blocks is unequal to a size of the window of relocation memory blocks.

13. The computer program product of claim 9, wherein selecting at least one of the user-write memory blocks or the relocation memory blocks comprises:

selecting at least one memory block from a window formed by a combination of user-write memory blocks and relocation memory blocks.

* * * * *